United States Patent [19]

Iwasa

[11] Patent Number: 4,982,377
[45] Date of Patent: Jan. 1, 1991

[54] ERASABLE PROGRAMMABLE READ ONLY MEMORY DEVICE IMPROVED IN OPERATION SPEED AND IN THE AMOUNT OF READ OUT CURRENT

[75] Inventor: Shoichi Iwasa, Tokyo, Japan
[73] Assignee: NEC Corporation, Tokyo, Japan
[21] Appl. No.: 457,913
[22] Filed: Dec. 27, 1989

[30] Foreign Application Priority Data
Dec. 27, 1988 [JP] Japan ................................ 63-331711

[51] Int. Cl.$^5$ .......................................... G11C 11/40
[52] U.S. Cl. .................................. 365/185; 357/23.5; 357/23.12
[58] Field of Search ............. 365/185; 357/23.5, 23.12

[56] References Cited

U.S. PATENT DOCUMENTS

| | | | |
|---|---|---|---|
| 4,580,247 | 4/1986 | Adam | 365/185 |
| 4,622,656 | 11/1986 | Kamiya et al. | 357/23.5 |
| 4,683,554 | 7/1987 | Lockwood et al. | 365/185 |
| 4,821,236 | 4/1989 | Hayashi et al. | 365/185 |
| 4,868,629 | 9/1989 | Eitan | 357/23.5 |
| 4,907,198 | 3/1990 | Arima | 365/185 |

*Primary Examiner*—Joseph E. Clawson, Jr.
*Attorney, Agent, or Firm*—Sughrue, Mion, Zinn, Macpeak & Seas

[57] ABSTRACT

An erasable programmable read only memory device includes a plurality of memory cells arranged in rows and columns, a plurality of word lines associated with the rows of the memory cells, respectively, and a plurality of digit line pairs respectively associated with the columns of the memory cells, each of the digit line pairs consists of a first digit line for a reading out operation and a second digit line for a write in operation, and each memory cell comprises a series combination of a selecting transistor of an enhancement type and a reading out transistor of a depletion type coupled between the first digit line and a source of constant voltage level and a write-in transistor of the enhancement type coupled between the second digit line and the source of constant voltage level and higher in impurity concentration than the read-out transistor for production of a large amount of hot carriers, in which a floating gate is shared between the reading out transistor and the write-in transistor for injecting the hot carriers from the write-in transistor into the floating gate at a high efficiency, and in which a control gate is coupled to one of the word lines and shared between the selecting transistor, the reading out transistor and the write-in transistor, so that the selecting transistor suppresses leakage current from the first digit line.

14 Claims, 7 Drawing Sheets

ERASABLE PROGRAMMABLE READ ONLY MEMORY DEVICE IMPROVED IN OPERATION SPEED AND IN THE AMOUNT OF READ OUT CURRENT

FIELD OF THE INVENTION

This invention relates to an erasable programmable read only memory device and, more particularly, to the structure of a memory cell incorporated therein.

DESCRIPTION OF THE RELATED ART

Figure 1:
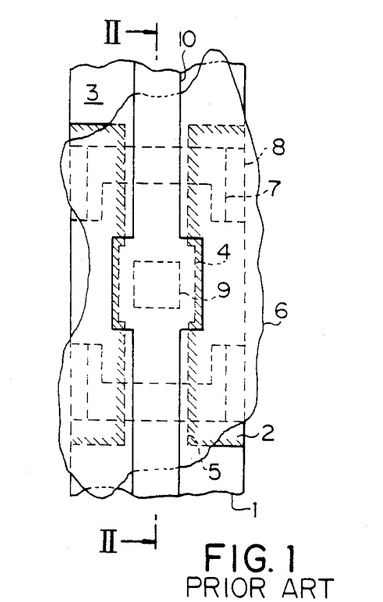
FIG. 1 is a plan view showing a layout of the first prior art erasable programmable read only memory device.
Figure 2:
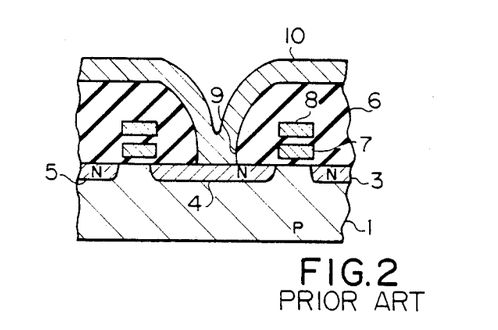
FIG. 2 is a cross sectional view taken along the line II—II of FIG. 1.

A typical example of the memory cell incorporated in the erasable programmable read only memory is illustrated in FIGS. 1 and 2 of the drawings. The memory cell is fabricated on a p-type silicon substrate 1, and a thick field oxide film 2 define an active area. For better understanding, hatched lines are provided along the boundary between the thick field oxide film 2 and the active area. In the active area, n-type impurity regions 3, 4 and 5 are formed, and the n-type impurity regions 3 and 4 serves as source and drain regions of the memory cell. The major surface of the substrate 1 is covered with an insulating film 6 of a silicon oxide, and a floating gate 7 as well as a control gate 8 both formed of a polysilicon are wrapped in the insulating film 6. The floating gate 7 and the control gate 8 are registry with each other, and the source and drain regions 3 (or 5) and 4 are formed in a self-align fashion by using these gates 7 and 8 as a mask. In the insulating film 6, a contact hole 9 is formed and a digit line 10 pass through the contact hole 9, and is brought into contact with the drain region 4.

When a data bit is written in the memory cell, a write-in signal of an extremely high voltage level is applied to the digit line 10, and a drain region is caused to go up to the extremely high voltage level. A break down takes place at the p-n junction between the drain region 4 and a channel region for producing hot carriers, and the hot carriers are injected into the floating gate 7 by the agency of the electric field produced by the control gate 8, thereby causing the memory cell to memorize the data bit. The memory cell is varied in the threshold voltage level due to the hot carriers trapped in the floating gate 7, and the difference in the threshold voltage level corresponds to the logic level of the data bit.

If the data bit should be erased from the memory cell, an ultra-violet light is radiated onto the memory cell, and, then, excites the hot carriers trapped into the floating gate 7. The hot carriers thus excited exceeds the barrier of 3.2 eV produced between the silicon and the silicon oxide, and the threshold voltage level is recovered into the original value. The memory cell shown in FIGS. 1 and 2 is of the enhancement type regardless of the data bit memorized therein.

However, a problem is encountered in the prior art erasable and programmable read only memory device in the access or read out speed. In detail, the channel region between the source and drain regions 3 (or 5) and 4 is heavily doped with p-type impurity atoms because of an acceleration of the write-in operation. If the channel region is heavily doped, the amount of the hot carriers produced upon the break down is increased so that the write-in operation is rapidly completed. However, the heavily doped channel region is causative of a high threshold voltage level upon reading out operation, and the high threshold voltage level deteriorates the access speed, because the signal on the control gate consumes a relatively long time period before reaching the high threshold voltage level. This is the first tradeoff inherent in the prior art erasable programmable read only memory device shown in FIGS. 1 and 2.

Moreover, the threshold voltage should satisfy the following relation.

$$0 < Vth_o < Vcc < Vth_w$$

where $Vth_O$ and $Vth_w$ are the threshold voltages before and after the write-in operation, respectively. If the source of positive voltage level is on the order of 1.5 volt, the $Vth_o$ should be adjusted to an extremely low level. Then, another problem is encountered in the prior art erasable and programmable read only memory device in that a large amount of sub-threshold current flows across the channel region due to the extremely lightly doped channel region in so far as the gate width is not so long. If the gate width is prolonged so as to restrict the subthreshold current, a long time period is consumed for the write-in operation, and the write-in speed would exceeds the ordinary standard of less than 1 millisecond. Thus, there is another tradeoff inherent in the prior art erasable and programmable read only memory device.

Figure 3:
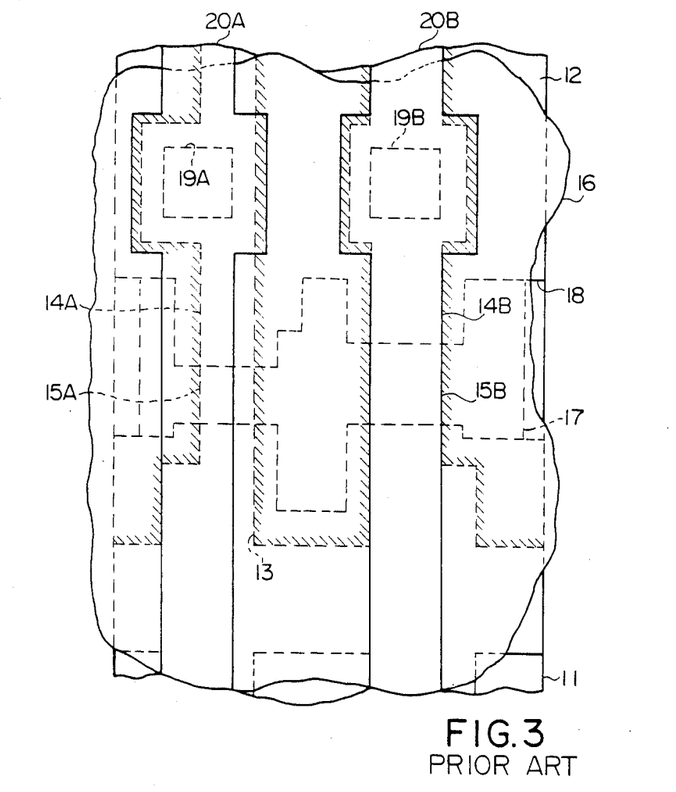
FIG. 3 is a plan view showing the layout of another prior art erasable programmable read only memory device proposed by Jagdish.

One of the solution is proposed by Jagdish Pathak et al in "HI-SPEED LOGIC", ISSCC 1988 Digest of Technical Paper, pages 144 and 145. FIG. 3 shows the structure of a memory cell proposed by Jagdish et al. The memory cell is fabricated on a silicon substrate 11, and a thick field oxide film 12 defines an active area. For the sake of better understanding, hatched lines are used for indicating boundaries between the thick field oxide film 12 and the active area. In the active area, n-type source and drain regions 13, 14A and 14B are formed, and the source region 13 is spaced from the drain regions 14A and 14B by channel regions 15A and 15B, respectively. The channel region is as long as 0.8 micron. The major surface of the substrate 11 is covered with an insulating oxide film 16 of a silicon oxide, and a floating gate 17 and a control gate 18 both formed of a polysilicon are embedded in the insulating film 17 over those areas of the channel regions 15A and 15B, thereby forming the FAMOS structure. According to the paper, the FAMOS gate oxide is 245 angstroms in thickness, and the inter-poly dielectric film is 295 angstroms thick. Contact holes 19A and 19B are formed in the insulating film 16, and digit lines 20A and 20B are brought into contact with the drain regions 14A and 14B through the contact holes 19A and 19B, respectively. The digit line 20A is used for the reading operation, and the digit line 20B is dedicated for the write-in operation, so that the related channel regions 15A and 15B are different in the impurity concentration. Namely, the channel region 15A is relatively low in the impurity concentration for achievement of a low threshold voltage level, however, the relatively high impurity concentration is imparted to the channel region 15B for high injection efficiency. The memory cell thus arranged occupies 52 square-micron.

In the write-in operation, the write-in signal is supplied from the digit line 20B to the drain region 14B for producing the hot carriers, and the control gate 18 attracts the hot carriers so that the hot carriers are trapped into the floating gate 17. Since the channel region 15B is heavily doped, a large amount of the hot carriers are produced for enhancement of the injection efficiency. On the other hand, the data bit is read out from the drain region 14A to the digit line 20A. In the read-out operation, since the channel region 14A is relatively low in the impurity concentration, the control gate 18 rapidly exceeds the threshold voltage level, and consumes a relatively short time period until the formation of the channel. According to the paper, the cell read current is 150 micro-ampere. The memory cell proposed by the Jagdish is of the enhancement mode regardless of the data bit memorized therein. Thus, the memory cell shown in FIG. 3 alters the channel region used depending upon the mode of operation, and the threshold voltage levels are decided in the manufacturing process of the semiconductor device.

Although the memory cell shown in FIG. 3 is free from the first tradeoff inherent in the memory cell of FIGS. 1 and 2, the second tradeoff is also inherent in the prior art erasable programmable read only memory device shown in FIG. 3. Because the threshold voltage level of the channel region 15A should be close to zero so as to produce the read-out current large enough to drive an associated sense amplifier circuit.

SUMMARY OF THE INVENTION

It is therefore an important object of the present invention to provide an erasable and programmable read only memory device which is improved in both write-in and read-out operation speeds.

It is also an important object of the present invention to provide an erasable and programmable read only memory device which is decreased in the sub-threshold current even if the amount of the read-out current is increased.

To accomplish these objects, the present invention proposes to provide a channel region of the enhancement type for the write-in operation and the other channel region of the depletion type for the read-out operation which are associated with a selecting transistor.

In accordance with one aspect of the present invention, there is provided a erasable programmable read only memory device fabricated on a semiconductor substrate of a first conductivity type and including a plurality of memory cells arranged in rows and columns, a plurality of word lines associated with the rows of the memory cells, respectively, and a plurality of digit line pairs respectively associated with the columns of the memory cells, each of the digit line pairs consisting of a first digit line for a reading out operation and a second digit line for a write in operation, each memory cell comprising: (a) a series combination of a selecting transistor of an enhancement type and a reading out transistor of a depletion type coupled between the first digit line and a source of constant voltage level; and (b) a write-in transistor of the enhancement type coupled between the second digit line and the source of constant voltage level, in which a floating gate is shared between the reading out transistor and the write-in transistor, and in which a control gate is coupled to one of the word lines and shared between the selecting transistor, the reading out transistor and the write-in transistor.

In accordance with another aspect of the present invention, there is provided an erasable programmable read only memory cell fabricated on a semiconductor substrate of a first conductivity type, comprising: (a) a first impurity region of a second conductivity type formed in the semiconductor substrate and serving as a common source region of a write-in transistor and a reading out transistor, the second conductivity type being opposite to the first conductivity type; (b) a second impurity region of the second conductivity type formed in the semiconductor substrate in a spacing relationship to the first impurity region and serving as a drain region of a selecting transistor, the second impurity region being coupled to a first digit line used for a reading out operation; (c) a first channel region of the second conductivity type contiguous to the first impurity region and serving as a channel region of the reading out transistor; (d) a second channel region of the first conductivity type located between the first channel region and the second impurity region and serving as a channel region of the selecting transistor; (e) a third impurity region of the second conductivity type formed in the semiconductor substrate in a spacing relationship to the first impurity region and serving as a drain region of the write-in transistor, the third impurity region being coupled to a second digit line for a write-in operation; (f) a third channel region of the first conductivity type located between the first and third impurity regions and serving as a channel region of the write-in transistor; (g) first, second and third gate insulating films covering the first, second and third channel regions, respectively; (h) a floating gate formed on the first and third gate insulating films and located over the first and third channel regions; (i) an inter-gate insulating film covering the floating gate; and (j) a control gate having a first portion formed on the inter-gate insulating film for being overlapped with the floating gate and a second portion formed on the second gate insulating film for being located over the second channel region.

In accordance with still another aspect of the present invention, there is provided an erasable programmable read only memory cell fabricated on a semiconductor substrate of a first conductivity type, comprising: (a) a first impurity region of a second conductivity type formed in the semiconductor substrate and serving as a common source region of a write-in transistor and a selecting transistor, the second conductivity type being opposite to the first conductivity type; (b) a second impurity region of the second conductivity type formed in the semiconductor substrate in a spacing relationship to the first impurity region and serving as a drain region of a reading out transistor, the second impurity region being coupled to a first digit line used for a reading out operation; (c) a first channel region of the second conductivity type contiguous to the second impurity region and serving as a channel region of the reading out transistor; (d) a second channel region of the first conductivity type located between the first channel region and the first impurity region and serving as a channel region of the selecting transistor; (e) a third impurity region of the second conductivity type formed in the semiconductor substrate in a spacing relationship to the first impurity region and serving as a drain region of the write-in transistor, the third impurity region being coupled to a second digit line for a write-in operation; (f) a third channel region of the first conductivity type located between the first and third impurity regions and serving as a channel region of the write-in transistor; (g) first, second and third gate insulating films covering the first, second and third channel regions, respectively; (h) a floating gate formed on the first and third gate insulating films and located over the first and third channel regions; (i) an inter-gate insulating film covering the floating gate; and (j) a control gate having a first portion formed on the inter-gate insulating film for being overlapped with the floating gate and a second portion formed on the second gate insulating film for being located over the second channel region.

BRIEF DESCRIPTION OF THE DRAWINGS

The features and advantages of an erasable and programmable read only memory device according to the present invention will be more clearly understood from the following description taken in conjunction with the accompanying drawings in which.

DESCRIPTION OF THE PREFERRED EMBODIMENT

First Embodiment

Figure 4:
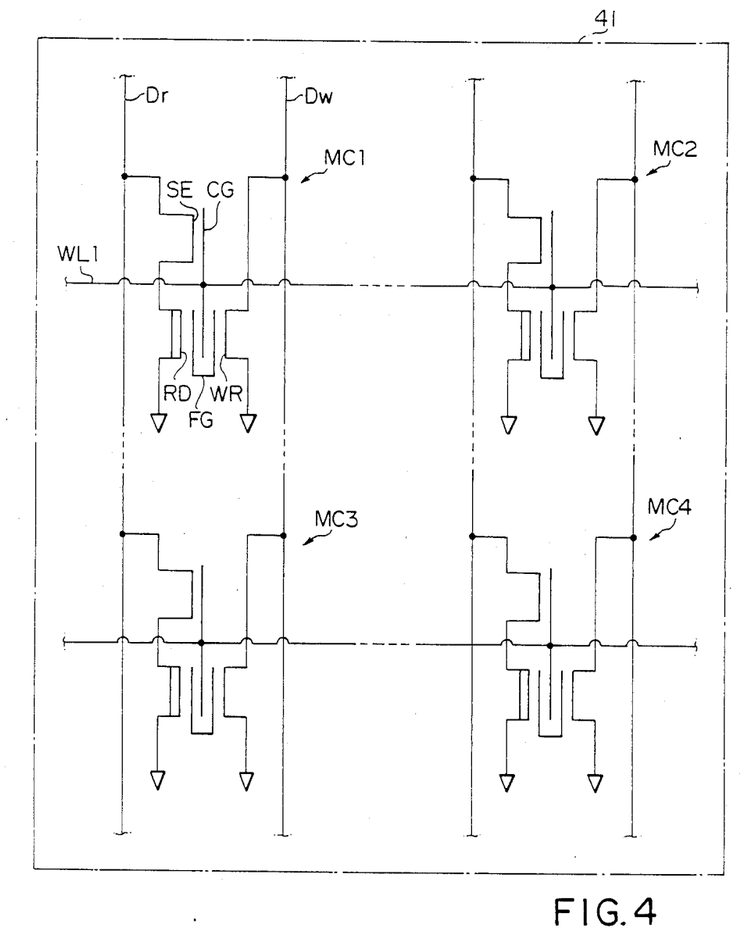
FIG. 4 is a circuit diagram showing the arrangement of an essential part of an erasable and programmable read only memory device embodying the present invention.

Referring first to FIGS. 4 of the drawings, a part of a memory cell array of the erasable and programmable read only memory device is fabricated on a p-type semiconductor substrate 41. The memory cell array is associated with various peripheral circuits such as, for example, sense amplifier circuits, the address decoder circuits, switching circuits and so forth, however, no description is made for these peripheral circuits, because the particular features of the Applicant's invention do not reside in those peripheral circuits.

FIG. 4 shows only four memory cells MC1, MC2, MC3 and MC4 each of the erasable programmable read only memory cell, and the other memory cells are omitted for the sake of simplicity. Since all of the memory cells are similar in circuit arrangement to one another, only the memory cell MC1 is focused for avoiding the repetition of the same description.

The memory cell MC1 comprises a series combination of a selecting transistor SE and a read-out transistor RD coupled between a first digit line Dr for data reading out use and a source of constant voltage level, and a write-in transistor WR coupled between a second digit line for data write-in used and the source of constant voltage level. The write-in transistor WR and the read-out transistor RD are of the floating gate type, and a floating gate FG is shared between those transistors WR and RD. A control gate CG is commonly used for all of the component transistors SE, RD and WR, and is coupled to one of the word lines WL1.

Figure 5:
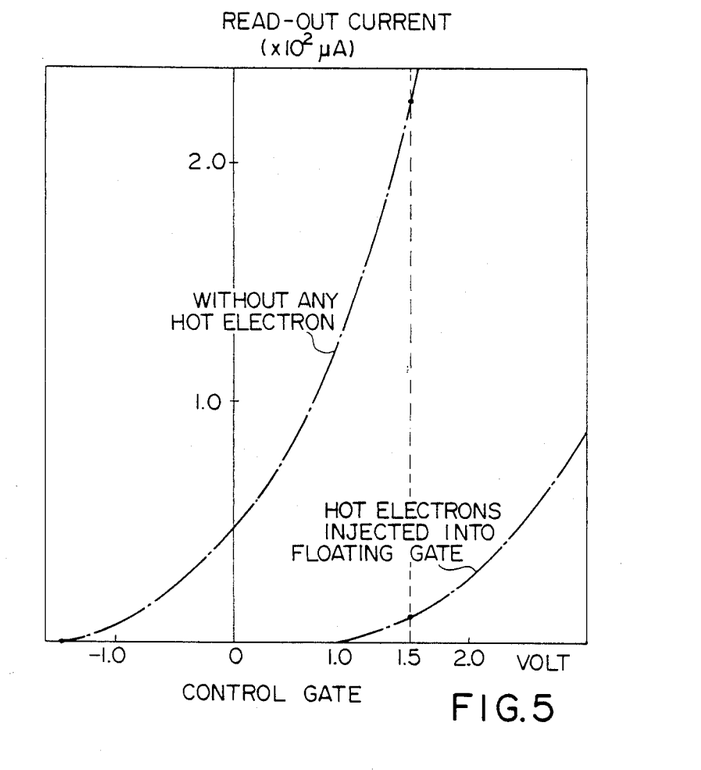
FIG. 5 is a graph showing the source-to-drain currents of the memory cell shown in FIG. 4 in terms of the gate voltage level.

In this instance, a power source (not shown) produces a positive voltage level of about 1.5 volt, and the threshold voltage level of the selecting transistor SE is on the order of 0.5 volts. If no hot electrons is injected into the floating gate FG, the depletion type read-out transistor RD allows read-out current of about 200 microampere to flow therethrough. However, the hot electrons injected into the floating gate FG change the threshold voltage level of the reading out transistor RD and, reduce the current to about 10 microampere as will be understood from FIG. 5. The threshold voltage level of the write-in transistor WR is higher than 1.5 volt, In a write-in operation on the memory cell MC1, a write-in control signal of is supplied to the word line WL1 and, accordingly, to the control gate CG, and a write-in signal of about 12.5 volts is concurrently applied to the second digit line Dw. Hot electrons are produced at the p-n junction between the channel and the drain region of the write-in transistor WR. The hot electrons thus produced are attracted toward the floating gate FG, and are trapped into the floating gate FG. The hot electrons changes the threshold voltage level of the reading out transistor RD, and, accordingly, a data bit is memorized in the memory cell MC1.

If an external device tries to access the data bit memorized in the memory cell MC1, the word line goes up to the positive voltage level of about 1.5 volt, and the selecting transistor SE turns on to provide a conduction path between the first digit line Dr and the reading out transistor RD. However, the reading out transistor RD merely flows the current of about 10 microampere, so that the first digit line Dr remains in the high voltage level which is decided as logic "1" level by the associated sense amplifier circuit (not shown). However, if no hot electron is injected into the floating gate FG, the selecting transistor SE as well as the reading out transistor RD allow the read-out current to flow therethrough. This situation causes the first digit line Dr to be lowered in voltage level, and the associated sense amplifier circuit decides the logic level as "0".

Figure 6:
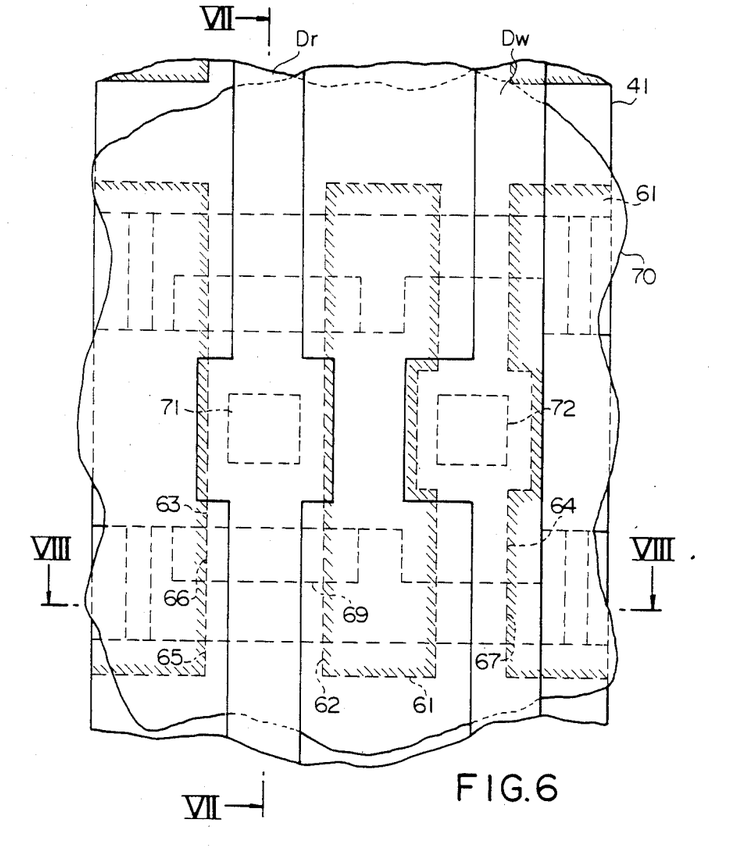
FIG. 6 is a plan view showing the layout of a memory cell incorporated in the erasable and programmable read only memory device shown in FIG. 4.
Figure 7:
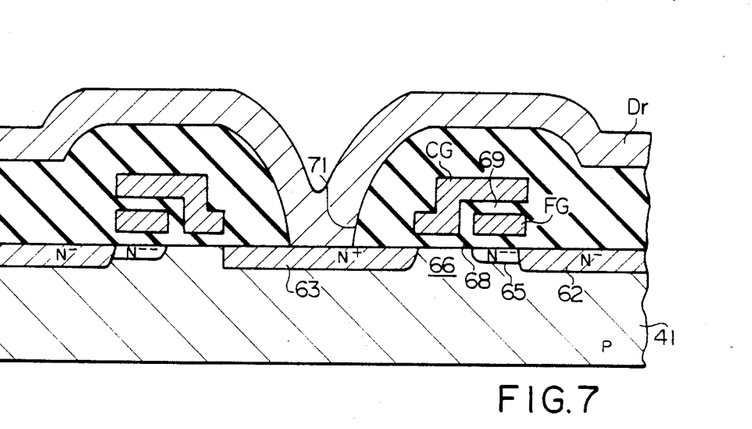
FIG. 7 is a cross sectional view taken along the line VII—VII of FIG. 4.
Figure 8:
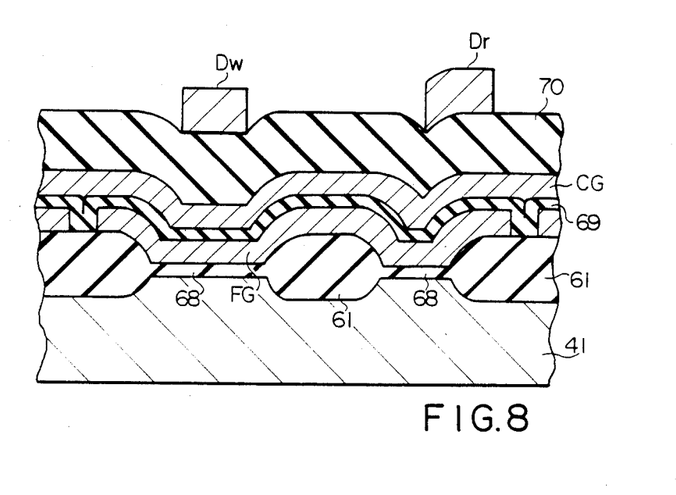
FIG. 8 is a cross sectional view taken along the line VIII—VIII of FIG. 4.

Turning to FIGS. 6, 7 and 8 of the drawings, the memory cell is formed in an active area defined by a thick field insulating film 61 of, for example, a silicon oxide. For easy discrimination, hatched lines are provided along boundary between the thick field insulating film and the active area. In the active area is formed first, second and third impurity regions 62, 63 and 64 which serves as a common source region of the reading out transistor RD and the write-in transistor WR, a drain region of the selecting transistor SE and a drain region of the write-in transistor WR, respectively. Between the first and second impurity regions 62 and 63 are located first and second channel regions 65 and 66 which provides channels for the reading out transistor RD and the selecting transistor SE, respectively. A third channel region 67 is disposed between the first and third impurity regions 62 and 64, and provides a channel of the write-in transistor WR. The first channel region is doped with arsenic atoms, and, for this reason, the reading out transistor RD is of the depletion type. The second channel region 66 is smaller in impurity density than the first impurity region, and the second impurity region 63 is larger in impurity density than the first impurity region.

As will be better seen from FIGS. 7 and 8, a gate insulating film of, for example, a silicon oxide 68 covers the first, second and third channel regions 65 to 67, and the floating gate FG of, for example, a polysilicon is formed on the gate insulating film 68 and extends over the thick field insulating film 61. The gate insulating film of the silicon oxide 68 contains first, second and third gate insulating films covering the first, second and third channel regions 65 to 67, respectively, however, no reference numeral is provided thereto for the sake of simplicity. The floating gate FG is located over the first and third channel regions 65 and 67, however, the floating gate FG is removed from that area over the second channel region 66. The floating gate FG is covered with a inter-gate insulating film of, for example, the silicon oxide, and the control gate of, for example, the polysilicon CG extends from the inter-gate insulating film 69 to the gate insulating film 68. Namely, the control gate CG has a first portion located over the first and third channel regions 65 and 67, a second portion located over the second channel region 66 and a vertical portion interconnecting the first and second portions. The control gate CG is covered with an inter-level insulating film 70 of, for example, the silicon oxide, and the first and second digit lines of, for example, an aluminum Dr and Dw extends on the inter-level insulating film 70 in parallel to each other. Contact holes 71 and 72 are formed in the insulating films for exposing the second and third impurity regions 63 and 64, and the first and second digit lines Dr and Dw are brought into contact with the second and third impurity regions 63 and 64, respectively.

Second Embodiment

Figure 9:
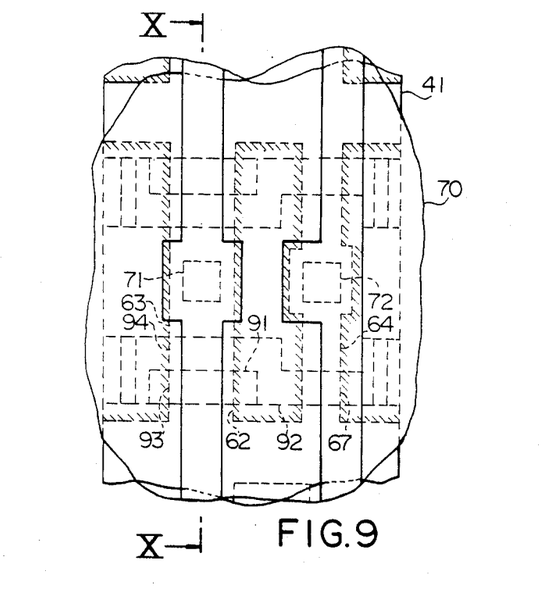
FIG. 9 is a plan view showing the layout of another memory cell incorporated in an erasable and programmable read only memory device embodying the present invention.
Figure 10:
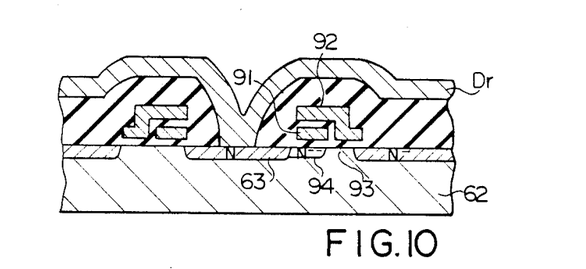
FIG. 10 is a cross sectional view taken along the line X—X of FIG. 9.

Turning to FIGS. 9 and 10 of the drawings, another memory cell according to the present invention is illustrated. The memory cell are similar in arrangement to the memory cell shown in FIGS. 6 to 8 except for the location of the reading out transistor RD and the selecting transistor SE, and, accordingly, a control gate 92 is different in configuration from the control gate CG. A floating gate 91 is also relocated in accordance with the above mentioned modification. For this reason, the corresponding parts and regions are designated by the same reference numerals used in FIGS. 6 to 8.

As will be seen from FIG. 10, the channel region 93 of the selecting transistor SE is contiguous to the first impurity region 62, and the channel region 94 of the reading out transistor RD is sandwiched between the channel region 93 and the second impurity region 63. In this instance, the selecting transistor SE is located closer to the common source region or the first impurity region 62, and, for this reason, the threshold voltage level of the selecting transistor SE is slightly decreased with respect to the selecting transistor of the first embodiment in so far as the channel region 93 is as large in impurity density as the channel region 66.

Moreover, the second impurity region 63 is doped with n-type impurity atoms in a self-aligned manner using the control gate 92 as a mask, and the left edge of the control gate 92 is over the floating gate 91, so that p-n junction between the drain region 63 and the substrate 41 is less damaged during the dry etching stage for the control gate 92.

Although particular embodiments of the present invention have been shown and described, it will be obvious to those skilled in the art that various changes and modifications may be made without departing from the spirit and scope of the present invention.

What is claimed is:

1. An erasable programmable read only memory device fabricated on a semiconductor substrate of a first conductivity type and including a plurality of memory cells arranged in rows and columns, a plurality of word lines associated with the rows of the memory cells, respectively, and a plurality of digit line pairs respectively associated with the columns of the memory cells, each of said digit line pairs consisting of a first digit line for a reading out operation and a second digit line for a write-in operation, each memory cell comprising:
   (a) a series combination of a selecting transistor of an enhancement type and a reading out transistor of a depletion type coupled between said first digit line and a source of constant voltage level; and
   (b) a write-in transistor of the enhancement type coupled between said second digit line and said source of constant voltage level, in which a floating gate is shared between said reading out transistor and said write-in transistor, and in which a control gate is coupled to one of said word lines and shared between said selecting transistor, said reading out transistor and said write-in transistor.

2. An erasable programmable read only memory device as set forth in claim 1, in which said control gate is supplied with a control signal swinging its voltage level within a voltage range.

3. An erasable programmable read only memory device as set forth in claim 2, in which said write-in transistor has a channel region with a second threshold voltage level out of said voltage range.

4. An erasable programmable read only memory device as set forth in claim 3, in which said first conductivity type is of the p-type.

5. An erasable programmable read only memory device as set forth in claim 4, in which said control signal goes up to about 1.5 volt for said reading out operation.

6. An erasable programmable read only memory device as set forth in claim 5, in which said first threshold voltage level is about 0.5 volts.

7. An erasable programmable read only memory device as set forth in claim 6, in which said reading out transistor allows a read out current on the order of 200 microampere in the presence of said floating gate without any electrons trapped therein, and in which said reading out transistor suppresses the read out current to about 10 microampere in the presence of said floating gate injected with hot electrons.

8. An erasable programmable read only memory cell fabricated on a semiconductor substrate of a first conductivity type, comprising:
   (a) a first impurity region of a second conductivity type formed in said semiconductor substrate and serving as a common source region of a write-in transistor and a reading out transistor, said second conductivity type being opposite to said first conductivity type;
   (b) a second impurity region of said second conductivity type formed in said semiconductor substrate in a spacing relationship to said first impurity region and serving as a drain region of a selecting transistor, said second impurity region being coupled to a first digit line used for a reading out operation;
   (c) a first channel region of said second conductivity type contiguous to said first impurity region and serving as a channel region of said reading out transistor;

(d) a second channel region of said first conductivity type located between said first channel and said second impurity region and serving as a channel region of said selecting transistor;

(e) a third impurity region of said second conductivity type formed in said semiconductor substrate in a spacing relationship to said first impurity region and serving as a drain region of said write-in transistor, said third impurity region being coupled to a second digit line for a write-in operation;

(f) a third channel region of said first conductivity type located between said first and third impurity regions and serving as a channel region of said write-in transistor;

(g) first, second and third gate insulating films covering said first, second and third channel regions, respectively;

(h) a floating gate formed on said first and third gate insulating films and located over said first and third channel regions;

(i) an inter-gate insulating film covering said floating gate; and (j) a control gate having a first portion formed on said inter-gate insulating film for being overlapped with said floating gate and a second portion formed on said second gate insulating film for being located over said second channel region.

9. An erasable programmable read only memory cell as set forth in claim 8, in which said first channel region is smaller in impurity density than said first impurity region.

10. An erasable programmable read only memory cell as set forth in claim 9, in which said second impurity region is larger in impurity density than said first impurity region.

11. An erasable programmable read only memory cell as set forth in claim 10, in which said first conductivity type is of the p-type.

12. An erasable programmable read only memory cell as set forth in claim 11, in which said control gate further has a vertical portion interconnecting said first portion and said second portion.

13. An erasable programmable read only memory cell fabricated on a semiconductor substrate of a first conductivity type, comprising:

(a) a first impurity region of a second conductivity type formed in said semiconductor substrate and serving as a common source region of a write-in transistor and a selecting transistor, said second conductivity type being opposite to said first conductivity type;

(b) a second impurity region of said second conductivity type formed in said semiconductor substrate in a spacing relationship to said first impurity region and serving as a drain region of a reading out transistor, said second impurity region being coupled to a first digit line used for a reading out operation;

(c) a first channel region of said second conductivity type contiguous to said second impurity region and serving as a channel region of said reading out transistor;

(d) a second channel region of said first conductivity type located between said first channel region and said first impurity region and serving as a channel region of said selecting transistor;

(e) a third impurity region of said second conductivity type formed in said semiconductor substrate in a spacing relationship to said first impurity region and serving as a drain region of said write-in transistor, said third impurity region being coupled to a second digit line for a write-in operation;

(f) a third channel region of said first conductivity type located between said first and third impurity regions and serving as a channel region of said write-in transistor;

(g) first, second and third gate insulating films covering said first, second and third channel regions, respectively;

(h) a floating gate formed on said first and third gate insulating films and located over said first and third channel regions;

(i) an inter-gate insulating film covering said floating gate; and (j) a control gate having a first portion formed on said inter-gate insulating film for being overlapped with said floating gate and a second portion formed on said second gate insulating film for being located over said second channel region.

14. An erasable programmable read only memory device as set forth in claim 2, in which said selecting transistor has a channel region with a first threshold voltage level within said voltage range.

* * * * *